US012362306B2

(12) United States Patent
Lanka et al.

(10) Patent No.: US 12,362,306 B2
(45) Date of Patent: Jul. 15, 2025

(54) CLOCK-GATING IN DIE-TO-DIE (D2D) INTERCONNECTS

(71) Applicant: Intel Corporation, Santa Clara, CA (US)

(72) Inventors: Narasimha Lanka, Dublin, CA (US); Debendra Das Sharma, Saratoga, CA (US); Lakshmipriya Seshan, Sunnyvale, CA (US); Gerald Pasdast, San Jose, CA (US); Zuoguo Wu, San Jose, CA (US); Swadesh Choudhary, Mountain View, CA (US)

(73) Assignee: Intel Corporation, Santa Clara, CA (US)

(*) Notice: Subject to any disclaimer, the term of this patent is extended or adjusted under 35 U.S.C. 154(b) by 445 days.

(21) Appl. No.: 17/733,545

(22) Filed: Apr. 29, 2022

(65) Prior Publication Data
US 2022/0262756 A1 Aug. 18, 2022

Related U.S. Application Data

(60) Provisional application No. 63/295,161, filed on Dec. 30, 2021.

(51) Int. Cl.
H01L 23/00 (2006.01)
G06F 1/04 (2006.01)
(Continued)

(52) U.S. Cl.
CPC .............. H01L 24/16 (2013.01); G06F 1/04 (2013.01); H01L 23/12 (2013.01);
(Continued)

(58) Field of Classification Search
CPC ....... G06F 1/04; H01L 23/12; H01L 23/5386; H01L 24/16; H01L 24/17; H01L 25/105; H01L 2224/16145; H01L 2924/15313
See application file for complete search history.

(56) References Cited

U.S. PATENT DOCUMENTS 9,158,328 B2    10/2015  Park et al.
2008/0043826 A1*  2/2008  Castro ............ G01R 31/318357
                                                                375/224

(Continued)

FOREIGN PATENT DOCUMENTS

WO    2021-225730 A1    11/2021

OTHER PUBLICATIONS

International Search Report and Written Opinion mailed Apr. 3, 2023 for International Application No. PCT/US2022/050959, 8 pages.

(Continued)

Primary Examiner — Henry Tsai
Assistant Examiner — John B Roche
(74) Attorney, Agent, or Firm — Schwabe, Williamson & Wyatt, P.C.

(57) ABSTRACT

Embodiments herein relate to action that are to be taken on various lanes of a die-to-die (D2D) interconnect in the event of clock-gating. Specifically, based on identification that a clock-gating event is to occur, physical layer (PHY) logic may direct PHY electrical circuitry to set the state of various of the lanes. In some embodiments, different actions may be taken based on whether the D2D interconnect is terminated or unterminated. Other embodiments may be described and claimed.

20 Claims, 6 Drawing Sheets

(51) Int. Cl.
  *H01L 23/12* (2006.01)
  *H01L 23/538* (2006.01)
  *H01L 25/10* (2006.01)

(52) U.S. Cl.
  CPC ........ *H01L 23/5386* (2013.01); *H01L 25/105* (2013.01); *H01L 24/17* (2013.01); *H01L 2224/16145* (2013.01); *H01L 2924/15313* (2013.01)

(56) References Cited

U.S. PATENT DOCUMENTS

| | | | |
|---|---|---|---|
| 2011/0202786 A1* | 8/2011 | Fojtik | G06F 11/0721 713/401 |
| 2013/0346800 A1* | 12/2013 | Gulati | G06F 11/27 714/E11.17 |
| 2014/0022002 A1 | 1/2014 | Chua-Eoan et al. | |
| 2016/0137200 A1* | 5/2016 | Wang | B60W 50/0225 701/1 |
| 2018/0329449 A1* | 11/2018 | Shimada | G06F 1/3278 |
| 2019/0021165 A1 | 1/2019 | Wig et al. | |
| 2020/0067526 A1* | 2/2020 | Wu | G06F 13/36 |
| 2021/0097015 A1 | 4/2021 | Das Sharma et al. | |

OTHER PUBLICATIONS

International Preliminary Report on Patentability mailed Jul. 11, 2024 for International Application No. PCT/US2022/050959, 5 pages.

* cited by examiner

CLOCK-GATING IN DIE-TO-DIE (D2D) INTERCONNECTS

CROSS-REFERENCE TO RELATED APPLICATIONS

The present application claims priority to U.S. Provisional Patent Application No. 63/295,161, filed on Dec. 30, 2021, and titled "TECHNIQUES TO MITIGATE TRANSISTOR AGING DURING BUS IDLE IN DIE-TO-DIE (D2D) INTERCONNECTS," the entire contents of which are hereby incorporated by reference herein in their entirety.

BACKGROUND

Multichip packaging may refer to the presence of multiple chips or dies in a single package. Multichip packaging may refer to a technology that enables performance growth in creation of complex products. Generally, multichip packages may need to operate a low error rates to meet stringent system failure and time requirements. The required low bit error rate and stringent requirements may allow for die disaggregation by allowing multiple separate die on a single package to operate like a single die.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1A:
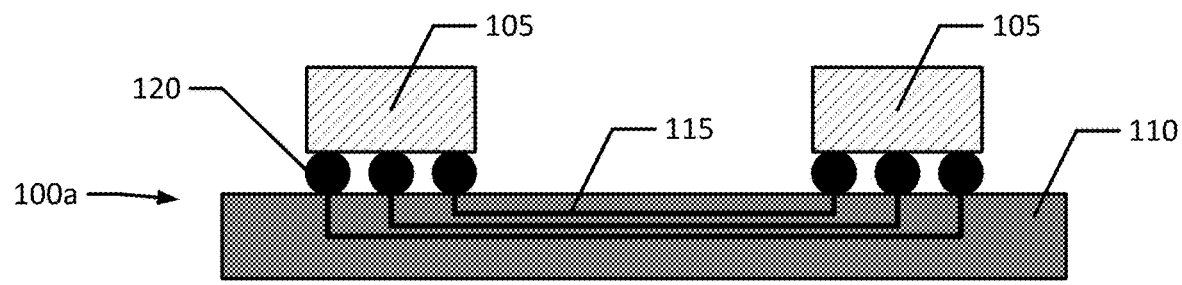
FIGS. 1a, 1b, and 1c illustrate various packages that may include die-to-die (D2D) interconnects, in accordance with various embodiments.

Embodiments described herein may include apparatus, systems, techniques, or processes that are directed to clock-gating on terminated or unterminated links. Specifically, embodiments herein may relate to identifying whether a link is terminated or unterminated, and then identifying one or more clock-gating rules based on whether the link is terminated or unterminated.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. It will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

As used herein, the term "module" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable components that provide the described functionality.

As described above, multichip packaging may enable multiple dies on a single package. Such packages may have low bit error rate and stringent failure in time requirements. Generally, on-package systems may be power sensitive such that reducing power consumption of the package may be desirable. Clock-gating may be one technique by which idle power of the package may be reduced. As used herein, "clock-gating" may refer to a technique by which a clock signal may be removed when a circuit or die-to-die (D2D) interconnect link of the package is not in use (i.e., when the system or the interconnect link is in an idle state). Specifically, the clock lane of such a circuit or D2D interconnect link may not carry a clock signal while the system or link are idle. Such an occurrence may be referred to herein as a "clock-gated event."

However, during clock-gating, the state of the data lanes and/or the clock lane may create undesirable effects if not properly managed. Specifically, keeping a lane in a single state for an extended period of time, or repeatedly putting a lane in the same state as may occur during sequential clock-gating events, may have undesirable effects on transistors of the dies or package. This effect may be referred to as "transistor aging." Transistor aging may lead to performance degradation of the transistors, dies, package, and/or interconnect link elements.

Embodiments relate to scrambling techniques that may mitigate the impact of transistor aging. Specifically, for interconnect links that are unterminated, the data lane may be set at the state of the last bit of transmitted data during a clock-gating event. For interconnect links that are terminated, the data lane may be set to a relatively high-impedance state during the clock-gating event. Similarly, the state of the clock lane may be directed to alternative between a high and a low state (e.g., a logical "1" and a logical "0") between sequential clock-gating events. Through these techniques, exit latencies for unterminated links may be reduced or mitigated. Additionally transistor aging effects may be mitigated because the data lanes and clock lanes may not always be put in the same state for sequential clock-gating events. Finally, by deactivating the clock circuit during an idle mode of the die, package, or link, aging effects of the clock circuit itself may be reduced or mitigated.

As used herein, a "terminated" link may refer to a link that includes one or more components at a receiver of the link that prevents electrical signals from reflecting along the link. Specifically, the receiver may include a connection to ground. Such terminated links may be present in, for example, a package such as package 100a described below wherein different dies of the package are coupled through a package substrate.

Similarly, an "unterminated" link may refer to a link that does not include one or more reflection-mitigation components at a receiver of the link. An unterminated link may be used in packages such as packages 100b or 100c wherein the package includes an interposer or a silicon bridge. In some cases, an unterminated link may be used in packages such as package 100a wherein different dies of the package are coupled through a package substrate.

Figure 1B:
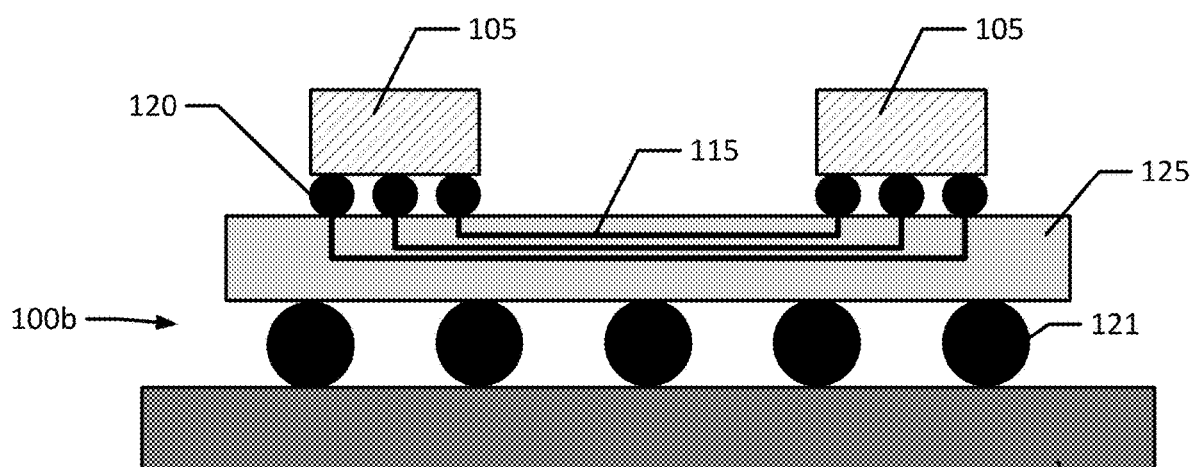
Figure 1C:
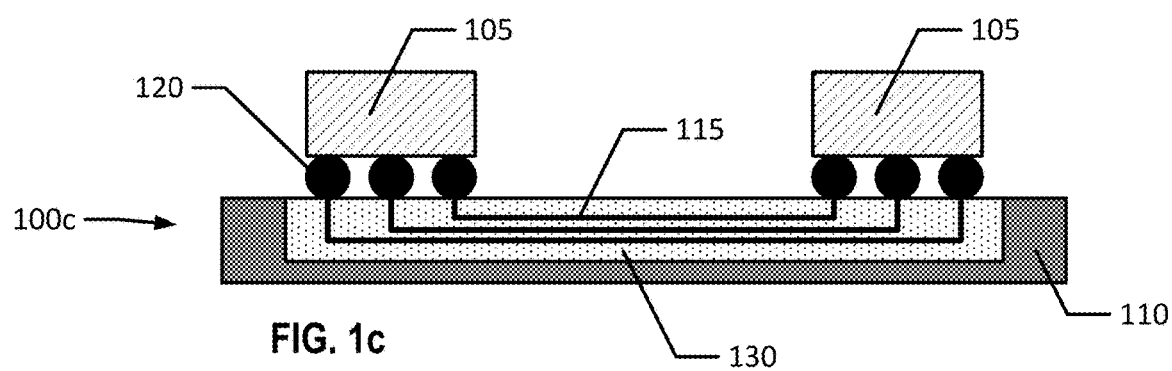

FIGS. 1a, 1b, and 1c (collectively "FIG. 1") illustrate various packages that may include die-to-die (D2D) interconnects, in accordance with various embodiments.

Specifically, FIG. 1a depicts an example package 100a that may include a plurality of dies 105. The dies may be, be related to, or include, for example, a processor, a multi-core processor, a memory, a retimer, and/or some other element. In some embodiments both dies 105 on a package may be the same type of element (e.g. both dies 105 may be processors), while in other embodiments the dies 105 may be of different types from one another. The dies 105 may be coupled with a package substrate 110 by a plurality of interconnects 120. The package substrate 110 may be, for example, a printed circuit board, a motherboard, or some other type substrate. The interconnects 120 may be, for example bumps of a ball grid array, pins of a pin grid array, or some other type of interconnect. The dies 105 may be communicatively coupled by one or more conductive element 115. The conductive elements 115 may be, include, or be part of, for example, micro-strips, strip lines, traces, vias, or some other type of conductive element.

In embodiments, one or more of the conductive elements 115 may be a part of a D2D interconnect link. The D2D interconnect link may include a clock lane, a valid lane, and a cluster of data lanes. Specifically, in some embodiments, such as the embodiment of FIG. 1a, the cluster of data lanes may include 16 data lanes on which data may be transmitted. In some embodiments, such as the embodiments of FIG. 1b or 1c the cluster of data lanes may include 64 data lanes on which data may be transmitted. In some embodiments, the "cluster" of data lanes may additionally or alternatively be referred to as a "module."

In some embodiments, different ones of the lanes of the D2D interconnect may be on different ones of the conductive elements 115. In other embodiments, one or more of the lanes of the D2D interconnect may be on a same one of the conductive elements 115 (for example, multiplexed onto a same conductive element 115).

FIG. 1b illustrates an alternative example package 100b. The package 100b may include various elements similar to those of package 100a, and their description will not be reiterated here for the sake of conciseness and clarity. The package 100 be may include and interposer 125 that is coupled with the package substrate 110 by a plurality of interconnects 121. The dies 105 may be coupled with the interposer 125 by interconnects 120. The interposer 125 may be a substrate such as package substrate 110, while in other embodiments the interposer 125 may be or include a different type of substrate. Generally, the interposer 125 may be a substrate configured to couple with dies 105 it a pitch smaller than that of a pitch of the package substrate 110. In some embodiments, the interposer 125 may be referred to as a chip on wafer on substrate (CoWoS) structure. In some embodiments, the interconnects 120 may be of the same type as interconnects 121 (for example, the may both be elements of a ball grid array or a pin grid array), while in other embodiments the interconnects 120 may be of a different form than interconnects 121.

FIG. 1c illustrates an alternative example package 100c. The package 100c may include various elements similar to those of package 100a, and their description will not be reiterated here for the sake of conciseness and clarity. The package may include a bridge 130 positioned in the package substrate 110. In some embodiments, the bridge 130 may be a silicon bridge. In this embodiment, the conductive elements 115 may be at least partially routed through the bridge 130. Generally, the bridge 130 may include a plurality of routing layers, allowing for multiple connections between various dies of a package to be communicatively coupled.

It will be understood that the various embodiments depicted in FIG. 1 are intended as high level example embodiments for the sake of discussion herein. The specific size, or relative sizes, of various elements are intended for illustration and discussion, rather than indicating real-world physical proportions. Additionally, the number of elements, for example the number of dies 105, interconnects 120, or conductive elements 115, may vary in different embodiments as well. Additionally, different embodiments may be combined. For example, in some embodiments a bridge 130 may be present in an interposer 125.

Figure 2:
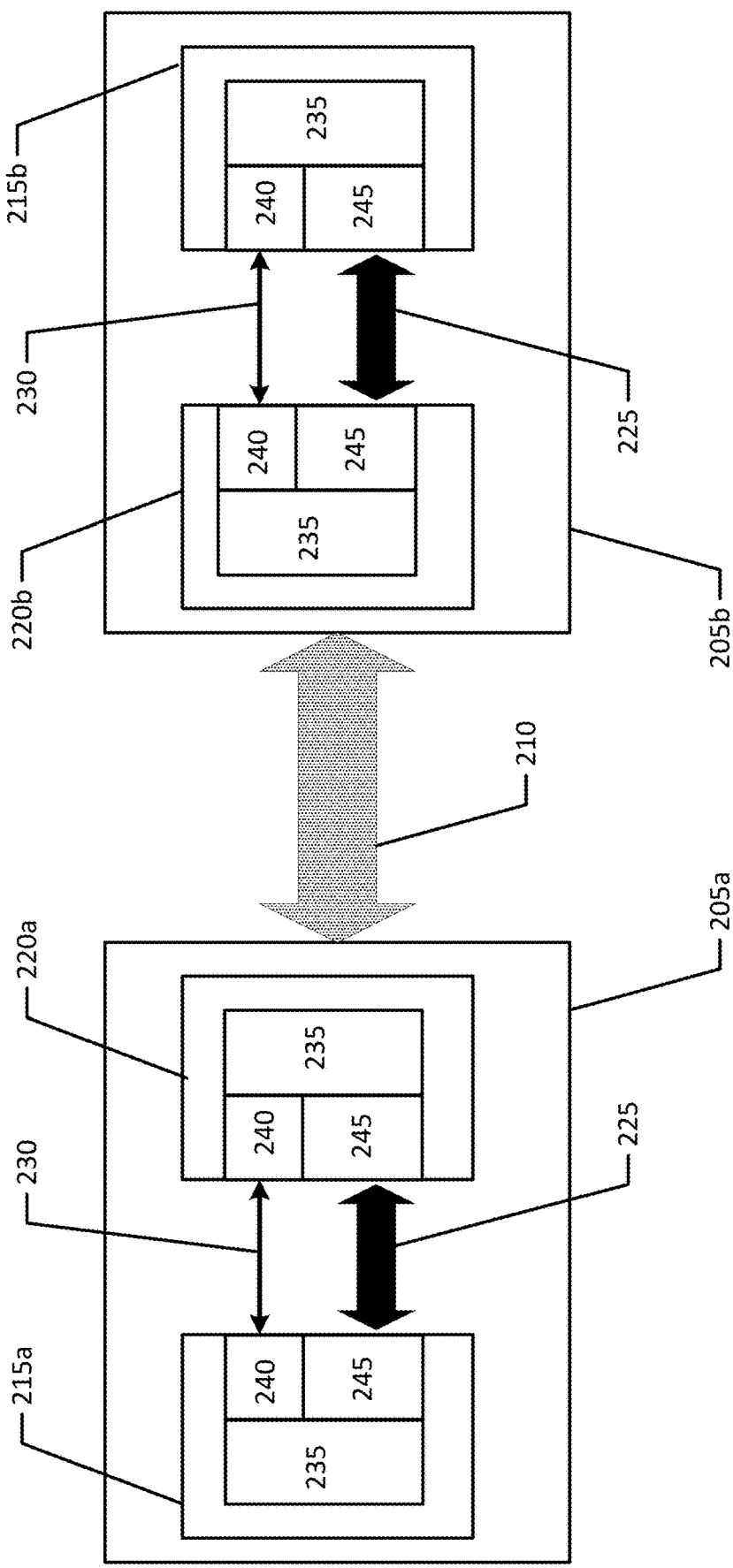
FIG. 2 illustrates example communication pathways between packages that may include D2D interconnects, in accordance with various embodiments.

FIG. 2 illustrates example communication pathways between packages that may include D2D interconnects, in accordance with various embodiments. Specifically, FIG. 2 depicts to packages 205a and 205b, which may be respectively similar to one of packages 100a, 100b, 100c, or some other package described with reference to FIG. 1. Package 205a may include die 215a and die 220a. Similarly, package 205b may include die 215b and die 220b. Dies 215a, 215b, 220a, and 220b may be similar to one of dies 105 described above. In some embodiments, the dies such as dies 215a/220a/215b/220b may be a die such as a processor, a memory, or some other type of die. In some embodiments, dies 220a/220b may be a retimer.

In some embodiments, the interconnect link formed of the mainband 225 and the sideband 230 may be an interconnect link in accordance with a protocol that is different from that of interconnect link 210. It will be noted that, although discussion herein is provided in the context of retransmission of data from package 205b to die 215a, in some embodiments the die 220a may also be configured to retransmit a signal from die 215a to package 205b.

As used herein, the mainband 225 may be a connection that constitutes a main data path of the D2D interconnect. The mainband may include a forwarded clock lane, a valid lane, and N lanes of data per link. In some embodiments, e.g., packages 100b or 100c, N may be 64. In some embodiments, e.g., package 100a, N may be 16. It will be noted that in some embodiments, additional lanes (e.g., a second valid lane, a second clock lane, etc.) may be present.

The sideband 230 may be a data interface that provides a back-channel for link training. The sideband 230 may additionally allow for access of registers of a link partner (e.g., access by die 220a to a register of die 215a, or vice-versa). The sideband 230 may consist of a forwarded clock lane and a data lane in each direction, and may have a fixed clock speed (e.g., a clock speed on the order of 800 megahertz (MHz)) regardless of a speed of the mainband 225.

The dies 215a/215b and dies 220a/220b may include physical layer (PHY) components such as sideband PHY layer circuitry 240, mainband PHY layer circuitry 245, and PHY layer logic 235 configured to transmit or receive various signals over the mainband 225 and sideband 230 of the D2D interconnect. The mainband PHY layer circuitry 245 and/or sideband PHY layer circuitry 240 may include electrical circuitry such as an analog front end (AFE) and be configured to transmit or receive one or more data signals over the mainband 225 and sideband 230, respectively. Specifically, the mainband PHY layer circuitry 245 may transmit and/or receive data signals over the cluster of data lanes, the valid lane, and the forwarded clock lane as described above. The sideband PHY layer circuitry 240 may transmit and/or receive sideband signals over the sideband 230, as described above. In some embodiments, the circuitry 240/245 may perform additional functions such as clocking, first-in-first-out (FIFO) buffering, serializing/deserializing (SERDES) of signals, etc.

The PHY layer logic 235 may be configured to control operation of the circuitry 240/245, and perform data processing/transfer between the circuitry 240/245 and an interface such as a D2D interface (not shown). Specifically, the logic 235 may perform actions such as link training, lane repair, lane reversal scrambling/de-scrambling, etc. of one or both of the mainband 225 and sideband 230.

It will be noted that, although only single instances of circuitry 240/245 or logic 235 are depicted on respective dies 215a/215b or dies 220a/220b, in other embodiments a die may have multiple PHY layer logics 235, each with a respective mainband circuitry 245 and sideband circuitry 240. Likewise, a die such as die 215a may be coupled with a plurality of other dies via respective mainbands and/or sidebands, or two dies may be coupled with multiple mainbands and/or sidebands. The particular configuration of these couplings may be based on the use case to which the various packages will be put.

Figure 3:
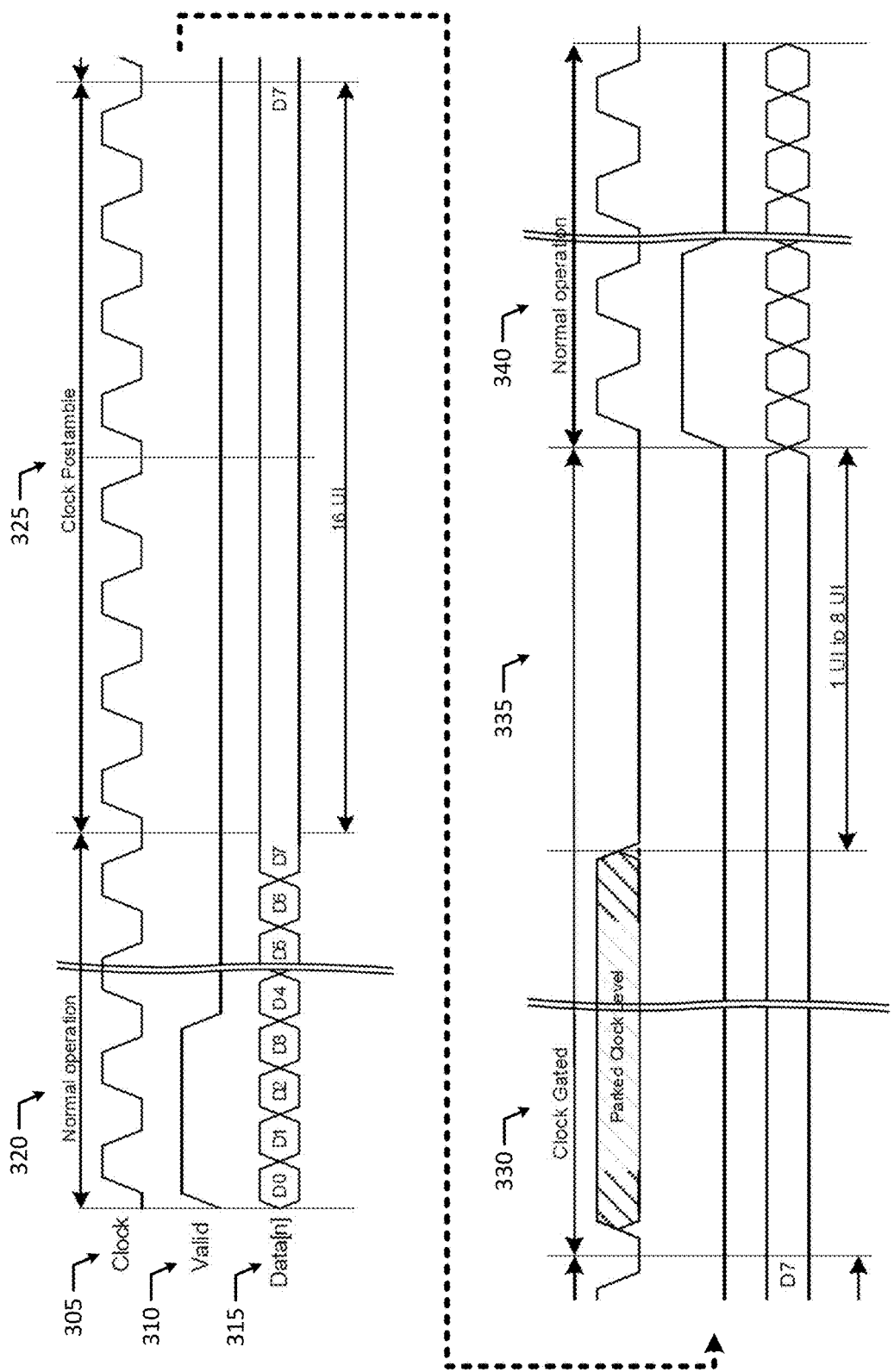
FIG. 3 illustrates an example timing diagram related to a clock-gating event, in accordance with various embodiments.

FIG. 3 illustrates an example timing diagram related to a clock-gating event, in accordance with various embodiments. Specifically, FIG. 3 illustrates an example timing diagram related to a clock-gating event on a mainband of an unterminated link. It will be understood that the example timing diagram of FIG. 3 has been split into two pieces as indicated by the dashed arrowed line. Additionally, the two pieces of the timing diagram include a small amount of overlap for the sake of the ease of interpretation.

As noted, the mainband of the interconnect link may include a clock lane 305, a valid lane 310, and one or more data lanes 315 that respectively transmit a clock signal, a valid signal, and one or more data signals. For the sake of ease of discussion, only 1 data lane is shown in FIG. 3. Generally, the clock-gating event may operate in accordance with the following clock-gating rule (hereinafter referred to as Rule 1:

If the Link is unterminated (all Advanced Package and unterminated Standard package links), Data lane transmitters must hold the last transmitted unit interval (UI). Valid Lane must be held below. Clock level in idle state (after meeting postamble requirement) must alternate between differential high and differential load during consecutive clock-gating events. Clock must drive a differential low for at least 1 UI or a maximum of 8 UI before normal operation.

FIG. 3 depicts an example of operation in accordance with Rule 1. It will be understood that the actions described herein (e.g., recognition or setting of values of different lanes) may be performed by logic such as PHY logic 235. Specific circuitry of the die (e.g., PHY layer circuitry 245) may then transmit at various levels as directed by the PHY logic.

At 320, the mainband of the interconnect may operate normally. That is, data may be transferred (e.g., by the PHY layer circuitry) on data lane 315 at respective UI's D0-D7. As may be seen, each UI may correspond to an oscillation of the clock signal and clock lane 305.

The PHY logic may then identify that there is no further data to be transmitted on the data lane 315. Upon identifying that there is no further data to be transmitted on the data lane 315, the PHY logic may identify the data lane 315 is idle, and identify that a clock-gating event is to occur. As a result, the D2D interconnect may enter a clock postamble stage at 325. As may be seen, the clock lane 305 may continue to oscillate. However, as indicated in Rule 1, the valid signal on valid lane 310 may be held low (e.g., at a logical "0"). Holding the valid signal low may indicate to a receiver that there is no data being transmitted on the data lane 315. Additionally, data lane 315 may be held at the state of the last transmitted UI (i.e., UI D7) in accordance with Rule 1. In some embodiments, the clock postamble stage 325 may occur over a span of 16 UIs, though in other embodiments the clock postamble may be longer or shorter.

The clock-gating event may then occur at 330. Specifically, as may be seen at 330, the data signal on data lane 315 may be held at the state of the last transmitted UI (i.e., UI D7). Similarly, the valid signal on the valid lane 310 may be held low. The clock signal on the clock lane 305 may be "parked." That is, the clock signal may be set to a state and held there during the clock-gating event at 330. In accordance with Rule 1, the state that the clock signal is set to may be based on the state of the clock signal in a sequentially preceding clock-gating event. Specifically, the state to which the clock signal is set may alternate during sequential clock-gating events such that the state of the clock signal is different than that of a preceding and subsequent clock-gating event.

Generally, it will be recognized that the state of the last UI D7 on the data lane 315 may be based upon the data being transmitted, and it is unlikely that the state of the UI D7 will be the same as the UI used to set the data lane in multiple preceding (or subsequent) clock-gating event. Specifically, the data may be scrambled using a pseudo-random binary sequence (PRBS) pattern to ensure transition density during data transmission. The PRBS may result in it being equally probable that UI D7 is in a high state or a low state.

Because the state of the data signal on the data lane 315 and the state of the clock signal on the clock lane 305 may be different over different clock-gating events, the transistor aging effects that may result from repeatedly transmitting the same state on the same lanes over multiple clock-gating events, as described above, may be mitigated. Specifically, the clock-gating event may have a time period on the order of picoseconds or nanoseconds, which is not long enough for transistor aging effects to occur based on holding the clock lane 405, valid lane 410, or data lane 415 in a single state for the length of the clock-gating event 330.

Subsequently to the clock-gating event, a return to normal operation stage may occur at 335. In accordance with Rule 1, the clock signal on the clock lane 305 may be set to a differential low state (e.g., a logical "0") for between 1 and 8 UI, and then normal operation may resume at 340 (which may be similar to the normal operation described above with respect to 320).

Figure 4:
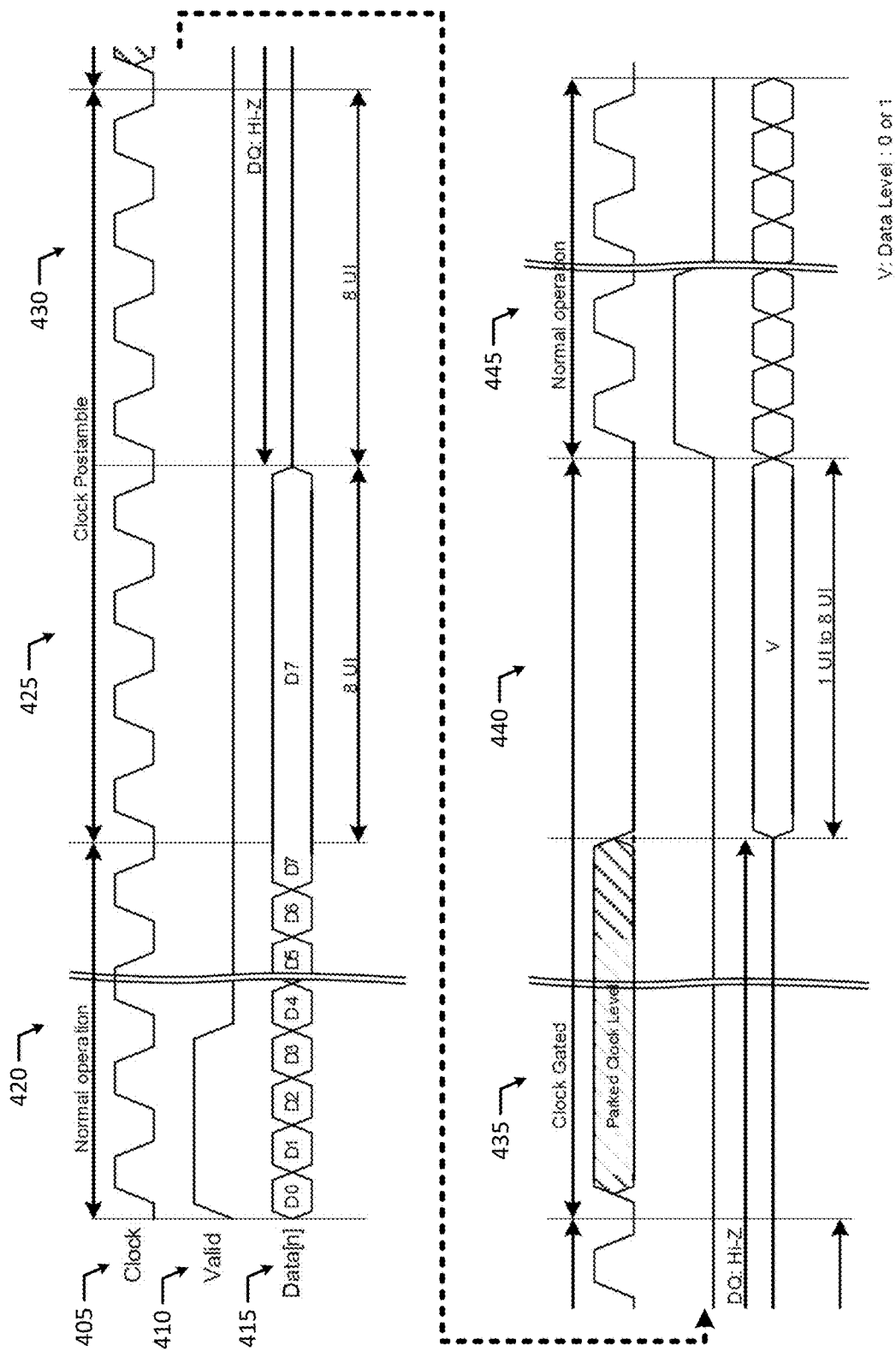
FIG. 4 illustrates an alternative example timing diagram related to a clock-gating event, in accordance with various embodiments.

FIG. 4 illustrates an alternative example timing diagram related to a clock-gating event, in accordance with various embodiments. Specifically, FIG. 4 illustrates an example timing diagram related to a clock-gating event on a main-band of a terminated link. It will be understood that the example timing diagram of FIG. 4 has been split into two pieces as indicated by the dashed arrowed line. Additionally, the two pieces of the timing diagram include a small amount of overlap for the sake of the ease of interpretation.

As noted, the mainband of the interconnect link may include a clock lane 405, a valid lane 410, and one or more data lanes 415 that respectively transmit a clock signal, a valid signal, and one or more data signals. For the sake of ease of discussion, only 1 data lane is shown in FIG. 4. Generally, the clock-gating event may operate in accordance with the following clock-gating rule (hereinafter referred to as Rule 2):

If the Link is terminated (e.g., Standard Package terminated Links), Data lanes transmitters must send the last UI for at least 1UI and up to 8UIs and then Hi-Z. Valid Lane must be held low. Clock idle state level must alternate between differential high and differential low during consecutive clock-gating events. Transmitters must precondition the Data Lanes to a 0 or 1 and clock must drive a differential low for at least 1 UI or up to a maximum of 8UIs before the normal transmission.

FIG. 4 depicts an example of operation in accordance with Rule 2. The operation may be performed by a combination of PHY logic and PHY circuitry as described above with respect to Rule 1. Specifically, at 420, the mainband of the interconnect may operate normally as described above with respect to normal operation 320. That is, data may be transferred on data lane 415 at respective UI's D0-D7. As may be seen, each UI may correspond to an oscillation of the clock signal and clock lane 405.

The clock postamble may then occur at 425 and 430. Stage 425 may be similar to the first 8 UI of stage 325 of FIG. 3, although it will be noted that, in accordance with Rule 2, stage 425 may be between 1 and 8 UIs long. At stage 430, in accordance with Rule 2, the data lane 415 may be set to a high-impedance (Hi-Z) state. Specifically, the Hi-Z state may refer to a state where impedance of the data lane 415 at the transmitter is increased such that there is no (or minimal) electrical current on the data lane (as opposed to the data lane being in a differential high or low state which still carries current as may occur during data transmission in normal operation 420).

The clock-gating event may then occur at 435. In accordance with Rule 2, the state of the clock lane 405 and valid lane 410 may be set as described above with respect to the clock-gating event 330 of FIG. 3. Specifically, the state of the clock lane 405 may alternate between sequential clock-gating events. Additionally, in accordance with Rule 2, the data lane 415 may be maintained at the Hi-Z state through the clock-gating event.

As described above, the alternating states of the clock lane 405 between sequential clock-gating events may mitigate transistor aging effects. Additionally, holding the data lane 415 in the Hi-Z state may similarly mitigate the transistor aging effects because the data lane 415 is not being held at a high or low state, but rather is being placed into an "off" state where there is no (or minimal) current being transmitted.

Subsequent to the clock-gating event at 435, a preconditioning stage may occur at 440. In the pre-conditioning stage, in accordance with Rule 2, the clock lane 405 may be set to a differential low state for between 1 and 8 UI. Similarly, the data lane 415 may be set to a differential high or low state for between 1 and 8 UI. This may allow the data lane time to re-calibrate or "wake up" from the Hi-Z state before normal operation begins at 445 (which may be similar to normal operation 420, described above).

It will be understood that the embodiments of FIGS. 3 and 4 are intended as example embodiments for the sake of discussion only. The specific numbers of elements (e.g., UIs) over which various stages occur, or the specific relative alignments of various lanes (e.g., the clock lane 405 and the valid lane 410 or data lane 415) may be different in other embodiments.

Figure 5:
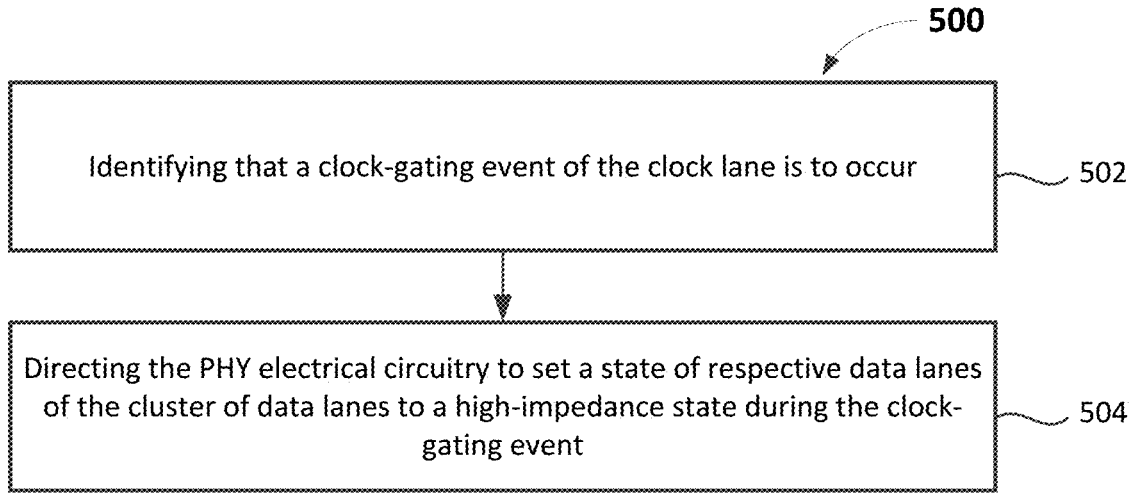
FIG. 5 illustrates an example process related to a clock-gating event that may occur on a terminated D2D interconnect link, in accordance with various embodiments.

FIG. 5 illustrates an example process 500 related to a clock-gating event that may occur on a terminated D2D interconnect link, in accordance with various embodiments. Generally, the process 500 may relate to "Rule 2" for a terminated link, as described above with respect to FIG. 4.

The process 500 may be performed, for example, by the system 600 (e.g., computing device). More specifically, the process 500 may be performed, for example, by PHY logic (e.g., PHY logic 235) of a multi-die package such as one of multi-die packages 100a, 100b, 100c, 205a, 205b, etc. As has been previously noted, the packages may include the PHY logic and PHY electrical circuitry such as mainband PHY layer circuitry 245. The PHY electrical circuitry may be configured to transmit data over a die-to-die (D2D) interconnect link such as the interconnect link described with respect to the mainband 225 and the sideband 230. As previously noted, the mainband may include a differential clock lane, a valid lane, and a cluster of data lanes.

The process may include identifying, at 502, that a clock-gating event of the clock lane is to occur. Such an identification may be based, for example, on an identification that the cluster of data lanes are to enter an idle state, as described above. In some embodiments, such identification may be based on analysis of one or more buffers of a transmitting die and identifying that an upcoming transmission may not occur based on the contents of the buffers (e.g., the buffers may be empty or substantially empty).

The process 500 may include further include directing, at 504, the PHY electrical circuitry (e.g., circuitry 245) to set a state of respective data lanes of the cluster of data lanes to a high-impedance (e.g., Hi-Z) state during the clock-gating event. In some embodiments, the process may further include setting the valid lane to a low state during the clock-gating event. In some embodiments, the process may further include directing the PHY electrical circuitry to set a state of the differential clock lane during the clock-gating event to a state different than a state of the clock lane during a preceding clock-gating event.

Figure 6:
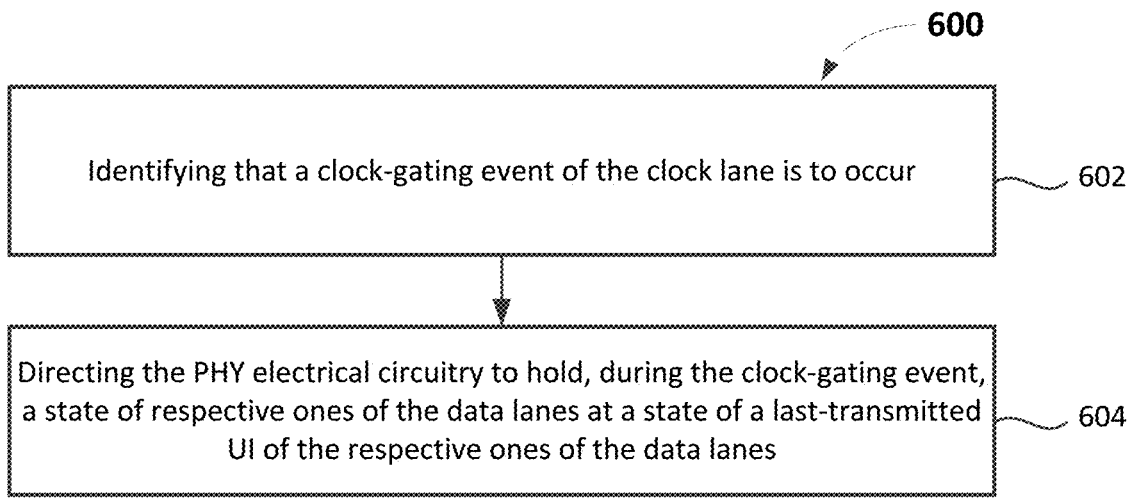
FIG. 6 illustrates an example process related to a clock-gating event that may occur on an unterminated D2D interconnect link, in accordance with various embodiments.

FIG. 6 illustrates an example process 600 related to a clock-gating event that may occur on an unterminated D2D interconnect link, in accordance with various embodiments. More specifically, the process 600 may generally relate to "Rule 1" for an unterminated link, as described above with respect to FIG. 3.

The process 600 may be performed, for example, by the system 700 (e.g., computing device). More specifically, the process 600 may be performed, for example, by PHY logic (e.g., PHY logic 235) of a multi-die package such as one of multi-die packages 100*a*, 100*b*, 100*c*, 205*a*, 205*b*, etc. As has been previously noted, the packages may include the PHY logic and PHY electrical circuitry such as mainband PHY layer circuitry 245. The PHY electrical circuitry may be configured to transmit data over a die-to-die (D2D) interconnect link such as the interconnect link described with respect to the mainband 225 and the sideband 230. As previously noted, the mainband may include a differential clock lane, a valid lane, and a cluster of data lanes.

The process may include identifying, at 602, that a clock-gating event of the clock lane is to occur. Such an identification may be based, for example, on an identification that the cluster of data lanes are to enter an idle state, as described above. In some embodiments, such identification may be based on analysis of one or more buffers of a transmitting die and identifying that an upcoming transmission may not occur based on the contents of the buffers (e.g., the buffers may be empty or substantially empty).

The process 600 may further include directing, at 604, the PHY electrical circuitry to hold, during the clock-gating event, a state of respective ones of the data lanes at a state of a last-transmitted UI of the respective ones of the data lanes. In some embodiments, the process 600 may further include directing the PHY electrical circuitry to set the valid lane to a low state during the clock-gating event. In some embodiments, the process 600 may further include directing the PHY electrical circuitry to set a state of the differential clock lane during the clock-gating event to a state different than a state of the clock lane during a preceding clock-gating event.

It should be understood that the actions described in reference to FIGS. 5 and 6 may not necessarily occur in the described sequence. For example, in some embodiments, the processes 500 or 600 may include more or fewer elements than depicted or described.

Figure 7:
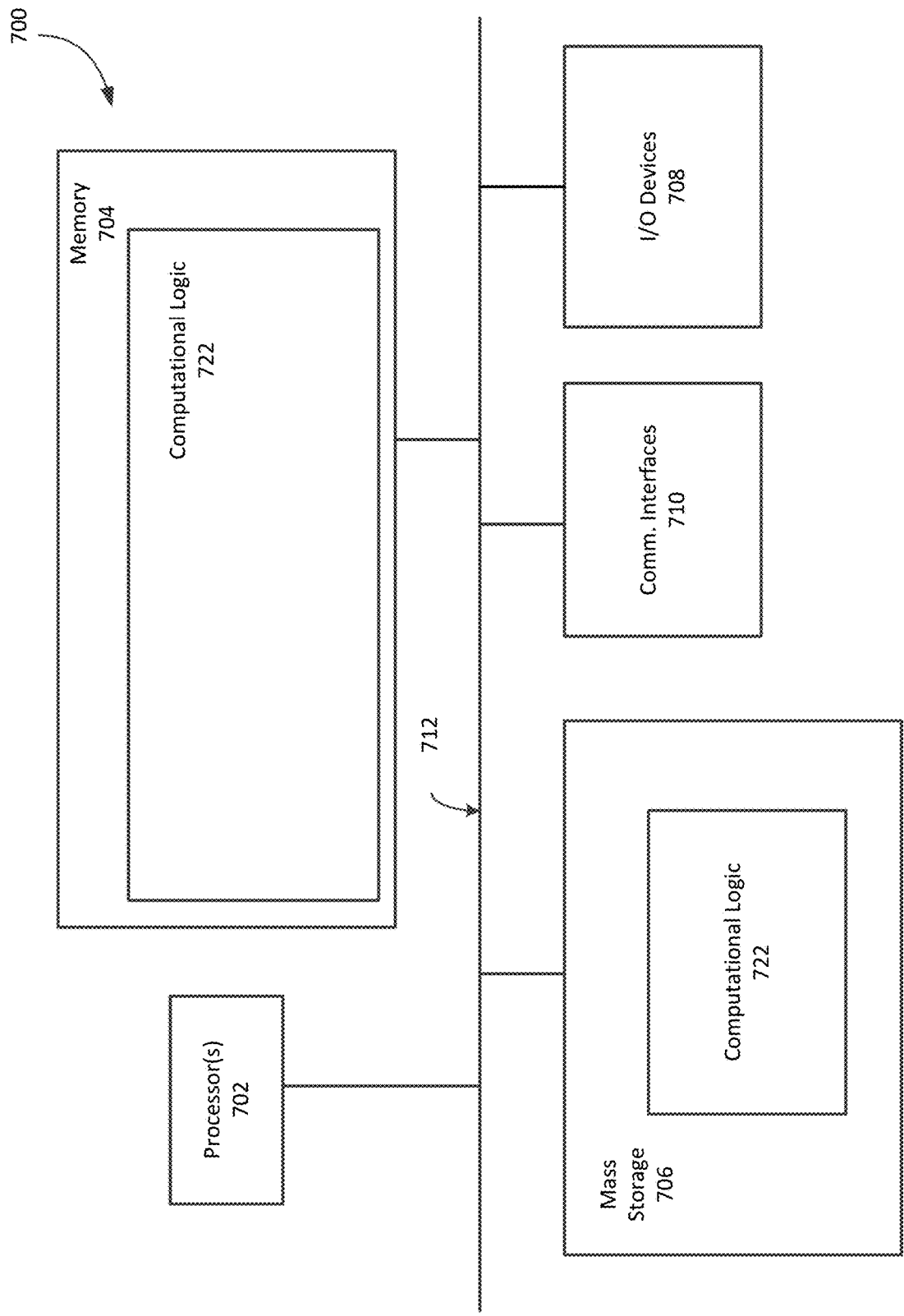
FIG. 7 illustrates an example computing system suitable for practicing various aspects of the disclosure, in accordance with various embodiments.

FIG. 7 illustrates an example computing device 700 suitable for use to practice aspects of the present disclosure, in accordance with various embodiments. For example, the example computing device 700 may be suitable to implement the functionalities associated with any of FIGS. 1-6 and/or some other Figure, technique, or process described herein. For example, the computer-device may include one or more of the packages of FIG. 1 or 2 that operate in accordance with the D2D link described above. Specifically, in some embodiments, one or more of the processor(s) 702 or some other element of the device may be a die such as one of the die of the packages of FIG. 1 or 2.

As shown, computing device 700 may include one or more processors 702, each having one or more processor cores, and system memory 704. The processor 702 may include any type of unicore or multi-core processors. Each processor core may include a central processing unit (CPU), and one or more level of caches. The processor 702 may be implemented as an integrated circuit. The computing device 700 may include mass storage devices 706 (such as diskette, hard drive, volatile memory (e.g., dynamic random access memory (DRAM)), compact disc read only memory (CD-ROM), digital versatile disk (DVD) and so forth). In general, system memory 704 and/or mass storage devices 706 may be temporal and/or persistent storage of any type, including, but not limited to, volatile and non-volatile memory, optical, magnetic, and/or solid state mass storage, and so forth. Volatile memory may include, but not be limited to, static and/or dynamic random access memory. Non-volatile memory may include, but not be limited to, electrically erasable programmable read only memory, phase change memory, resistive memory, and so forth.

The computing device 700 may further include input/output (I/O) devices 708 such as a display, keyboard, cursor control, remote control, gaming controller, image capture device, one or more three-dimensional cameras used to capture images, and so forth, and communication interfaces 710 (such as network interface cards, modems, infrared receivers, radio receivers (e.g., Bluetooth), and so forth). I/O devices 708 may be suitable for communicative connections with three-dimensional cameras or user devices. In some embodiments, I/O devices 708 when used as user devices may include a device necessary for implementing the functionalities of receiving an image captured by a camera.

The communication interfaces 710 may include communication chips (not shown) that may be configured to operate the device 700 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 710 may operate in accordance with other wireless protocols in other embodiments.

The above-described computing device 700 elements may be coupled to each other via system bus 712, which may represent one or more buses. In the case of multiple buses, they may be bridged by one or more bus bridges (not shown). Each of these elements may perform its conventional functions known in the art. In particular, system memory 704 and mass storage devices 706 may be employed to store a working copy and a permanent copy of the programming instructions implementing the operations and functionalities associated with any of FIGS. 1-6 and/or some other Figure, technique, or process described herein, generally shown as computational logic 722. Computational logic 722 may be implemented by assembler instructions supported by processor(s) 702 or high-level languages that may be compiled into such instructions.

The permanent copy of the programming instructions may be placed into mass storage devices 706 in the factory, or in the field, though, for example, a distribution medium (not shown), such as a compact disc (CD), or through communication interfaces 710 (from a distribution server (not shown)).

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

EXAMPLES

Example 1 includes a method to be performed by one or more processors of an electronic device, wherein the method comprises: identifying, by the one or more processors, whether a link is terminated or unterminated; and controlling, by the one or more processors based on whether the link is terminated or unterminated, a clock lane related to the link, a data lane related to the link, and a valid lane related to the link to address effects of transistor aging.

Example 2 includes the method of example 1, wherein the link is a chiplet express interconnect (CXi) link.

Example 3 includes the method of any of examples 1-2, and/or some other example herein, wherein the link is a link of a die-to-die (D2D) interconnect.

Example 4 includes the method of any of examples 1-3, and/or some other example herein, wherein identifying that the link is terminated is based on identifying that the link is a standard package terminated link.

Example 5 includes the method of any of examples 1-4, and/or some other example herein, wherein identifying that the link is unterminated is based on identifying that the link is an advanced package or unterminated standard package link.

Example 6 includes the method of any of examples 1-5, and/or some other example herein, wherein if the link is unterminated, controlling the clock lane, data lane, and valid lane include one or more of: controlling data lane transmitters to hold the last transmitted UI; controlling the valid lane to be held low; and controlling the clock level in idle state to alternative between differential high and differential low during consecutive clock-gating events.

Example 7 includes the method of example 6, and/or some other example herein, further comprising controlling, by the one or more processors, a clock related to the clock lane to drive a differential low for between 1 UI and 8 UIs before normal operation Example 8 includes the method of example 6, and/or some other example herein, wherein a UI is a unit interval.

Example 9 includes the method of example 6, and/or some other example herein, wherein controlling the clock level in idle state is to occur after meeting a related clock postamble requirement.

Example 10 includes the method of any of examples 1-5, and/or some other example herein, wherein if the link is terminated, controlling the clock lane, data lane, and valid lane include one or more of: controlling data lane transmitters to send a last UI for at between 1 UI and 8 UIs; controlling the valid lane to be held low; and controlling the clock idle state level to alternate between differential high and differential low during consecutive clock-gating events.

Example 11 includes the method of example 10, and/or some other example herein, further comprising controlling, by the one or more processors, the data lane transmitters to be in a high-impedance (Hi-Z) mode subsequent to sending the last UI.

Example 12 includes the method of example 10, and/or some other example herein, further comprising controlling, by the one or more processors, the data lane transmitters to precondition the data lanes to a 0 or 1.

Example 13 includes the method of example 12, and/or some other example herein, further comprising controlling, by the one or more processors, a clock related to the clock lane to drive a differential low for between 1 and 8 UIs before normal transmission.

Example 14 includes the method of example 10, and/or some other example herein, wherein a UI is a unit interval.

Example 15 includes the method of any of examples 1-14, and/or some other example herein, further comprising scrambling, by the one or more processors, data that is to be transmitted on the link.

Example 16 includes the method of example 15, and/or some other example herein, wherein the scrambling includes using a pseudo-random binary sequence (PRBS) pattern.

Example 17 includes a die for use on a multi-die package, wherein the die comprises: physical layer (PHY) electrical circuitry to transmit data over a terminated die-to-die (D2D) interconnect link, wherein the interconnect link includes a sideband and a mainband, and wherein the mainband includes a differential clock lane, a valid lane, and a cluster of data lanes; and PHY logic coupled to the PHY electrical circuitry, wherein the PHY logic is to: identify that a clock-gating event of the clock lane is to occur; and direct the PHY electrical circuitry to set a state of respective data lanes of the cluster of data lanes to a high-impedance state during the clock-gating event.

Example 18 includes the die of example 17, and/or some other example herein, wherein the PHY logic is to identify that the clock-gating event of the clock lane is to occur is based on an identification that the cluster of data lanes are to enter an idle state.

Example 19 includes the die of example 18, and/or some other example herein, wherein the idle state is a state in which data is not transmitted on the cluster of data lanes for at least 8 unit intervals (UIs).

Example 20 includes the die of any of examples 17-19, and/or some other example herein, wherein the PHY logic is further to direct the PHY electrical circuitry to set the valid lane to a low state during the clock-gating event.

Example 21 includes the die of any of examples 17-20, and/or some other example herein, wherein the PHY logic is further to direct the PHY electrical circuitry to set a state of the differential clock lane during the clock-gating event to a state different than a state of the clock lane during a preceding clock-gating event.

Example 22 includes the die of any of examples 17-21, and/or some other example herein, wherein the PHY logic is further to direct the PHY electrical circuitry to set the state of the respective data lanes to a state of a last bit of data transmitted on the respective data lanes for between 1 unit interval (UI) and 8 UIs prior to setting the state of the respective data lanes to the high-impedance state.

Example 23 includes the die of any of examples 17-22, and/or some other example herein, wherein the PHY logic is further to direct the PHY electrical circuitry to set the state of the respective data lanes to a logical "0" or a logical "1" for between 1 unit interval (UI) and 8 UIs after the clock-gating event and before transmitting data on a data lane of the cluster of data lanes.

Example 24 includes the die of any of examples 17-23, and/or some other example herein, wherein the PHY logic is further to direct the PHY electrical circuitry to set the state of the clock lane to a differential low for between 1 unit interval (UI) and 8 UIs after the clock-gating event and before transmitting data on a data lane of the cluster of data lanes.

Example 25 includes the die of any of examples 17-24, and/or some other example herein, wherein setting the state of the respective data lanes to the high-impedance state includes disabling transmitters of the respective data lanes.

Example 26 includes the die of any of examples 17-25, and/or some other example herein, wherein a terminated link is a link that includes a connection to ground at a receiver interface of the interconnect link.

Example 27 includes the die of any of examples 17-26, and/or some other example herein, wherein the PHY logic is further to direct the PHY electrical circuitry to set the state of the respective data lanes to the high-impedance state to reduce the effects of transistor aging on the data lane during a plurality of clock-gating events.

Example 28 includes a die for use on a multi-die package, wherein the die comprises: physical layer (PHY) electrical circuitry to transmit data over an unterminated die-to-die (D2D) interconnect link, wherein the interconnect link includes a sideband and a mainband, and wherein the mainband includes a differential clock lane, a valid lane, and a cluster of data lanes; and PHY logic coupled to the PHY electrical circuitry, wherein the PHY logic is to: identify that a clock-gating event of the clock lane is to occur; and direct the PHY electrical circuitry to hold, during the clock-gating event, a state of respective ones of the data lanes at a state of a last-transmitted unit interval (UI) of the respective ones of the data lanes.

Example 29 includes the die of example 28, and/or some other example herein, wherein the PHY logic is further to direct the PHY electrical circuitry to set the state of the clock lane to a differential low for between 1 UI and 8 UIs after the clock-gating event and before transmitting data on a data lane of the cluster of data lanes.

Example 30 includes the die of any of examples 28-29, and/or some other example herein, wherein the PHY logic is further to direct the PHY electrical circuitry to hold the state of the respective ones of the data lanes at the state of the last-transmitted UI of the respective ones of the data lanes for 16 UIs preceding the clock-gating event.

Example 31 includes the die of any of examples 28-30, and/or some other example herein, wherein the PHY logic is further to direct the PHY electrical circuitry to set the valid lane to a low state during the clock-gating event.

Example 32 includes the die of any of examples 28-31, and/or some other example herein, wherein the PHY logic is to identify that the clock-gating event of the clock lane is to occur is based on an identification that the cluster of data lanes are to enter an idle state.

Example 33 includes the die of example 32, and/or some other example herein, wherein the idle state is a state in which data is not transmitted on the cluster of data lanes for at least 8 unit intervals (UIs).

Example 34 includes the die of any of examples 28-33, and/or some other example herein, wherein the PHY logic is further to direct the PHY electrical circuitry to set a state of the differential clock lane during the clock-gating event to a state different than a state of the clock lane during a preceding clock-gating event.

Example 35 includes the die of example 34, and/or some other example herein, wherein the PHY logic is further to direct the PHY electrical circuitry to set the state of the differential clock lane during the clock-gating event to the state different than the state of the clock lane during the preceding clock-gating event to reduce the effects of transistor aging on the clock lane during a plurality of clock-gating events.

Example 36 includes the die of any of examples 28-35, and/or some other example herein, wherein the unterminated link traverses an interposer or silicon bridge of the package.

Example Z01 may include an apparatus comprising means to perform one or more elements of a method described in or related to any of examples 1-36 herein, and/or any other method or process described herein.

Example Z02 may include an apparatus comprising logic, modules, or circuitry to perform one or more elements of a method described in or related to any of examples 1-36 herein, and/or any other method or process described herein.

Example Z03 may include a method, technique, or process as described in or related to any of examples 1-36 herein, and/or portions or parts thereof.

Example Z04 may include a signal as described in or related to any of examples 1-36 herein, and/or portions or parts thereof.

The invention claimed is:

1. A die for use on a multi-die package, wherein the die comprises:
   physical layer (PHY) electrical circuitry to transmit data over a terminated die-to-die (D2D) interconnect link, wherein the interconnect link includes a sideband and a mainband, and wherein the mainband includes a differential clock lane, a valid lane, and a cluster of data lanes; and
   PHY logic coupled to the PHY electrical circuitry, wherein the PHY logic is to:
      identify that a clock-gating event of the clock lane is to occur; and
      direct the PHY electrical circuitry to set a state of respective data lanes of the cluster of data lanes to a high-impedance state during the clock-gating event.

2. The die of claim 1, wherein the PHY logic is to identify that the clock-gating event of the clock lane is to occur is based on an identification that the cluster of data lanes is to enter an idle state.

3. The die of claim 2, wherein the idle state is a state in which data is not transmitted on the cluster of data lanes for at least 8 unit intervals (UIs).

4. The die of claim 1, wherein the PHY logic is further to direct the PHY electrical circuitry to set the valid lane to a low state during the clock-gating event.

5. The die of claim 1, wherein the PHY logic is further to direct the PHY electrical circuitry to set a state of the differential clock lane during the clock-gating event to a state different than a state of the clock lane during a preceding clock-gating event.

6. The die of claim 1, wherein the PHY logic is further to direct the PHY electrical circuitry to set the state of the respective data lanes to a state of a last bit of data transmitted on the respective data lanes for between 1 unit interval (UI) and 8 UIs prior to setting the state of the respective data lanes to the high-impedance state.

7. The die of claim 1, wherein the PHY logic is further to direct the PHY electrical circuitry to set the state of the respective data lanes to a logical "0" or a logical "1" for between 1 unit interval (UI) and 8 UIs after the clock-gating event and before transmitting data on a data lane of the cluster of data lanes.

8. The die of claim 1, wherein the PHY logic is further to direct the PHY electrical circuitry to set the state of the clock lane to a differential low for between 1 unit interval (UI) and 8 UIs after the clock-gating event and before transmitting data on a data lane of the cluster of data lanes.

9. The die of claim 1, wherein setting the state of the respective data lanes to the high-impedance state includes disabling transmitters of the respective data lanes.

10. The die of claim 1, wherein a terminated link is a link that includes a connection to ground at a receiver interface of the interconnect link.

11. The die of claim 1, wherein the PHY logic is further to direct the PHY electrical circuitry to set the state of the respective data lanes to the high-impedance state to reduce effects of transistor aging on the data lane during a plurality of clock-gating events.

12. A die for use on a multi-die package, wherein the die comprises:
physical layer (PHY) electrical circuitry to transmit data over an unterminated die-to-die (D2D) interconnect link, wherein the interconnect link includes a sideband and a mainband, and wherein the mainband includes a differential clock lane, a valid lane, and a cluster of data lanes; and
PHY logic coupled to the PHY electrical circuitry, wherein the PHY logic is to:
identify that a clock-gating event of the clock lane is to occur; and
direct the PHY electrical circuitry to hold, during the clock-gating event, a state of respective ones of the data lanes at a state of a last-transmitted unit interval (UI) of the respective ones of the data lanes.

13. The die of claim 12, wherein the PHY logic is further to direct the PHY electrical circuitry to set the state of the clock lane to a differential low for between 1 UI and 8 UIs after the clock-gating event and before transmitting data on a data lane of the cluster of data lanes.

14. The die of claim 12, wherein the PHY logic is further to direct the PHY electrical circuitry to hold the state of the respective ones of the data lanes at the state of the last-transmitted UI of the respective ones of the data lanes for 16 UIs preceding the clock-gating event.

15. The die of claim 12, wherein the PHY logic is further to direct the PHY electrical circuitry to set the valid lane to a low state during the clock-gating event.

16. The die of claim 12, wherein the PHY logic is to identify that the clock-gating event of the clock lane is to occur is based on an identification that the cluster of data lanes is to enter an idle state.

17. The die of claim 16, wherein the idle state is a state in which data is not transmitted on the cluster of data lanes for at least 8 unit intervals (UIs).

18. The die of claim 12, wherein the PHY logic is further to direct the PHY electrical circuitry to set a state of the differential clock lane during the clock-gating event to a state different than a state of the clock lane during a preceding clock-gating event.

19. The die of claim 18, wherein the PHY logic is further to direct the PHY electrical circuitry to set the state of the differential clock lane during the clock-gating event to the state different than the state of the clock lane during the preceding clock-gating event to reduce effects of transistor aging on the clock lane during a plurality of clock-gating events.

20. The die of claim 12, wherein the unterminated link traverses an interposer or silicon bridge of the package.

* * * * *